United States Patent [19]

Huang et al.

[11] Patent Number: 5,264,799
[45] Date of Patent: Nov. 23, 1993

[54] AUTOMATIC TRANSFORMER TESTING APPARATUS

[75] Inventors: Yincheng Huang; Yiing H. Hwang; Ying Y. Huang, all of Chung Li, Taiwan

[73] Assignee: San Horng Electric Factory Co., Ltd., Chung Li, Taiwan

[21] Appl. No.: 915,100

[22] Filed: Jul. 16, 1992

[51] Int. Cl.⁵ ............................................. G01R 31/06
[52] U.S. Cl. .................................. 324/726; 324/547; 414/223; 198/345.2; 198/478.1
[58] Field of Search ...................... 324/547, 654, 726; 414/222, 223; 198/345.2, 478.1

[56] References Cited

U.S. PATENT DOCUMENTS

| | | | |
|---|---|---|---|
| 2,203,878 | 6/1940 | Rosenberg | 324/726 |
| 2,760,620 | 8/1956 | Hull et al. | 198/478.1 |
| 3,662,881 | 5/1972 | Fineran | 414/222 |
| 4,285,233 | 8/1981 | Swis | 198/478.1 |

*Primary Examiner*—Kenneth A. Wieder
*Assistant Examiner*—Glenn W. Brown
*Attorney, Agent, or Firm*—Dvorak and Traub

[57] ABSTRACT

A rotatable circular platform is used for automatically testing power transformers. The rotatable circular platform is provided with a plurality of carrier tracks equally spaced around the periphery of the rotatable circular platform; each one of the carrier tracks is adapted to carry a power transformer to be tested and is provided with a corresponding connecting post having a pair of connecting contact points. Around the outer periphery is a plurality of stationary posts, each one of which has a pair of stationary contact points to allow a sliding engagement with the connecting contact points of the connecting posts. Each pair of the stationary contacts is electrically connected to a test instrument to test the performances of power transformers, while each pair of the connecting contact points is provided with a pair of clamps to clamp onto the test terminals of a power transformer loaded on a corresponding carrier track. The rotatable circular platform is driven to rotate an angular increment at one time to stop at a test position where the connecting contact points come into contact with the stationary contact points such that the power transformer is electrically connected to the test instrument which conducts a test and causes the computer-controlled driving device to operate as soon as the test is completed.

3 Claims, 6 Drawing Sheets

AUTOMATIC TRANSFORMER TESTING APPARATUS

BACKGROUND OF THE INVENTION

This invention relates to an automatic transformer testing apparatus, more particularly an apparatus for automatically testing the performances of a power transformer without requiring a testing operator repeatedly to disconnect-and-connect the power supply lines during the testing process so as to avoid the risk of high voltage electric shocks.

A power transformer for use in a power transmission system must pass a series of performance tests after it has been manufactured and before installation in the system. Such performance tests conventionally include a NO-LOAD LOSS TEST, a HIGH VOLTAGE ENDURANCE TEST, an INDUCTION VOLTAGE TEST, as well as other kinds of tests depending upon the specific application and relevant national codes. FIG. 1 shows a conventional testing station for conducting such performance tests, which station includes a plurality of testing tables 1A, 1B and 1C disposed in a test room 1; each testing table having one pair of clamps 2, 2', or 2" respectively connected to a central testing instrument 1D located outside test room 1. A power transformer (hereinafter referred to simply as a transformer) 3 is placed on a roller conveyor 1E and moved from a storage area to a first position corresponding to first testing table 1A where transformer 3 is first connected to central testing instrument 1D by clamping first pair of clamps 2" on to a pair of test terminals 4 of transformer 3 and then an appropriate voltage is applied to transformer 3 to conduct a first test, which may be the NO-LOAD LOSS TEST. As soon as the first test has been completed, first pair of clamps 2" is removed from test terminals 4 of transformer 3, and transformer 3 is moved to second test table 1B where a second test, which may be the HIGH VOLTAGE ENDURANCE TEST, is conducted in the same manner as the first test. Subsequent tests are conducted in the same manner. During the series of tests, clamps 2, 2', or 2" are manually clamped on and disconnected from test terminals 4 by a test operator, and transformer 3 is also pushed from one position to the next by a test operator. As the tests usually employ voltages as high as 10 KV, the test operator is exposed to the risk of electric shocks. Moreover, tests conducted by such conventional test apparatus are slow and inefficient.

SUMMARY OF THE INVENTION

In view of the above-described problems with conventional test apparatuses for testing the performance of transformers, the present invention offers an improved testing apparatus for automatically testing the performances of a transformer without the test operator having to manually connect and disconnect the power supply lines during the testing process.

The automatic transformer test apparatus of this invention includes a rotatable circular platform on which is provided a plurality of carrier tracks and a plurality of connecting posts corresponding to the carrier tracks. The carrier tracks and connecting posts are equally spaced around the peripheral edge of the rotatable circular platform. A plurality of stationary posts are provided around the rotatable circular platform. Each one of the stationary posts has a pair of stationary contact points electrically connected to a central test instrument. Each one of the connecting posts on the rotatable circular platform is provided with a pair of connecting contact points adapted to engage or come into contact with the stationary contact points of each stationary post when the rotatable circular platform rotates to a position where the connecting posts on the rotatable circular platform are aligned with the stationary posts. Each one of the connecting posts is further provided with a pair of clamps connected by cables to the pair of connecting contact points of the connecting post. The rotatable circular platform is driven by a computer-controlled drive unit which causes the rotatable circular platform to rotate intermittently at a pre-determined interval such that the connecting posts of the rotatable circular platform are caused to move during a pre-determined period from one position where the connecting contact points of the connecting posts come into contact with the stationary contact points of the stationary posts to a subsequent position where the connecting contact points of the connecting posts come into contact with the stationary contacts of subsequent stationary posts. The transformers to be tested are loaded onto the carrier tracks one after another such that one transformer is loaded onto one carrier track each time. At the loading position where the transformer is loaded onto a carrier track of the rotatable circular platform, a first transformer is connected to the connecting contact points of the first connecting post corresponding to the carrier track on which the transformer is positioned, by clamping a pair of the clamps to said first connecting post to the test terminals of the first transformer. Then, the rotatable circular platform is rotated to move the first transformer from the loading position to a first position where the connecting contact points of the first connecting post come into contact with the stationary contact points of a first stationary post, such that the first transformer is electrically connected to the central test instrument. The rotatable circular platform is caused to stop for a pre-determined period during which period, a second transformer can be loaded on to a second carrier track at the loading position. As soon as the first test has been completed, the rotatable circular platform is caused to rotate such that the first transformer is moved from the first position to a second position where the connecting contact points of the first connecting post are caused to come into contact with the stationary contact points of a second stationary post, and the second transformer is moved from the loading position to the first position where the connecting contact points of the second connecting post are caused to come into contact with the stationary contact points of the first stationary post. At this second position, the rotatable circular platform is caused to stop for the first transformer to undergo a second test and, at the same time, the second transformer at the first position undergoes the first test, and a third transformer is loaded onto a third carrier track. By following the same process through all subsequent test positions, the performance testing of the first transformer is completed and then the first transformer is moved to an unloading position where the clamps of the connecting contact post are removed from the test terminals of the first transformer, and the first transformer is unloaded from the first carrier track. The test data are processed and compiled by the central test instrument and a test report is produced through a display device or a printer associated with the central test instrument.

DETAILED DESCRIPTION OF A PREFERRED EMBODIMENT

Figure 1:
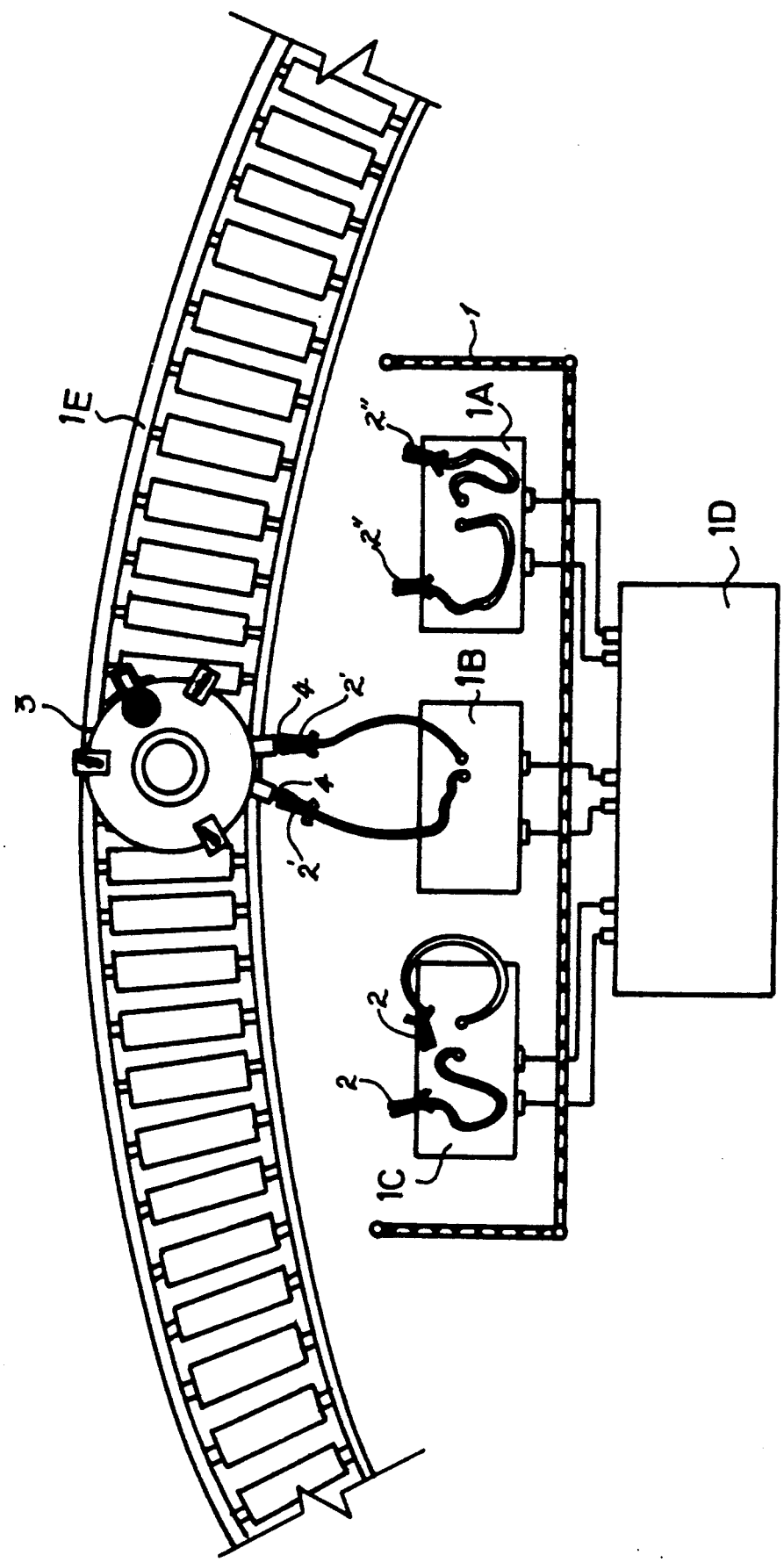
FIG. 1 is a schematic plan view of a conventional apparatus for testing power transformers.
Figure 2:
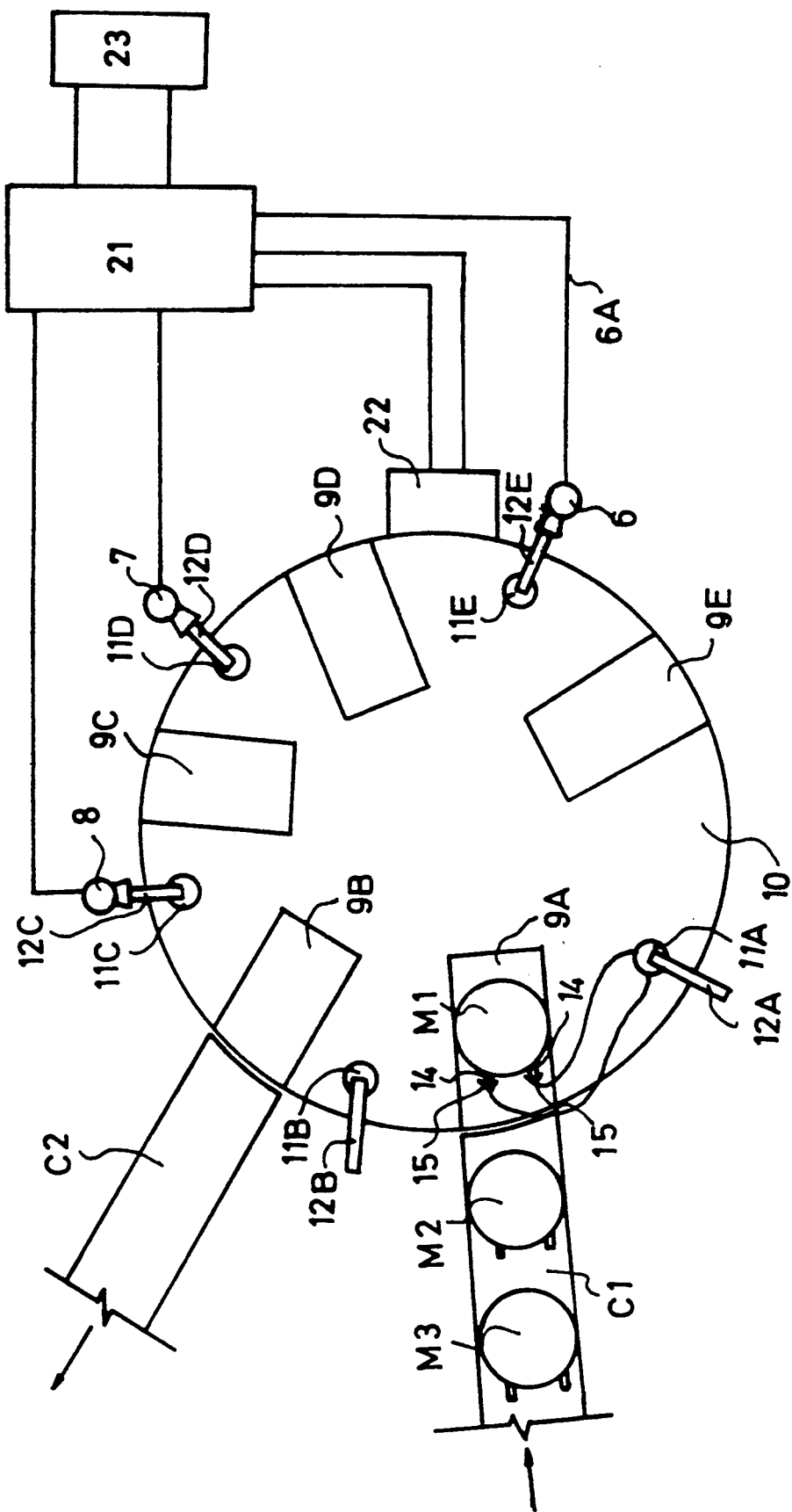
FIG. 2 is a schematic plan view of an embodiment of the automatic transformer testing apparatus of this invention, showing the state when a first transformer is being loaded onto the apparatus.

Referring now to FIG. 2, the automatic transformer testing apparatus of this invention includes a rotatable circular platform 10 operated by a computer-controlled driving device 22 to rotate intermittently at pre-determined intervals, and a plurality (for example, five) of carrier tracks 9A-9E provided on the upper side of rotatable circular platform 10. Carrier tracks 9A-9E are equally spaced along the peripheral edge of rotatable circular platform 10. Each one of carrier tracks 9A-9E is provided with one connecting post (represented by one of 11A-11E) installed at one side of each carrier track; each one of connecting posts 11A-11E has a pair of connecting contact points (represented by one of 12A-12E). Three stationary posts 6, 7 and 8 are installed around rotatable circular platform 10 at positions corresponding to the spacing of connecting posts 11B-11C. Each one of stationary posts 6, 7 and 8 has a pair of stationary contact points 13 electrically connected to a central test instrument 21. Each one of the pairs of connecting contact points 12A-12E is formed by a pair of conductive blades (as shown in FIGS. 4 and 5) and each one of the pairs of stationary contact points 13 is made of a conductive plate formed into the shape of a clip and adapted to allow the blades of connecting contact points 11A-11E to slidably fit into the respective clips to form an electrical connection.

Figure 4:
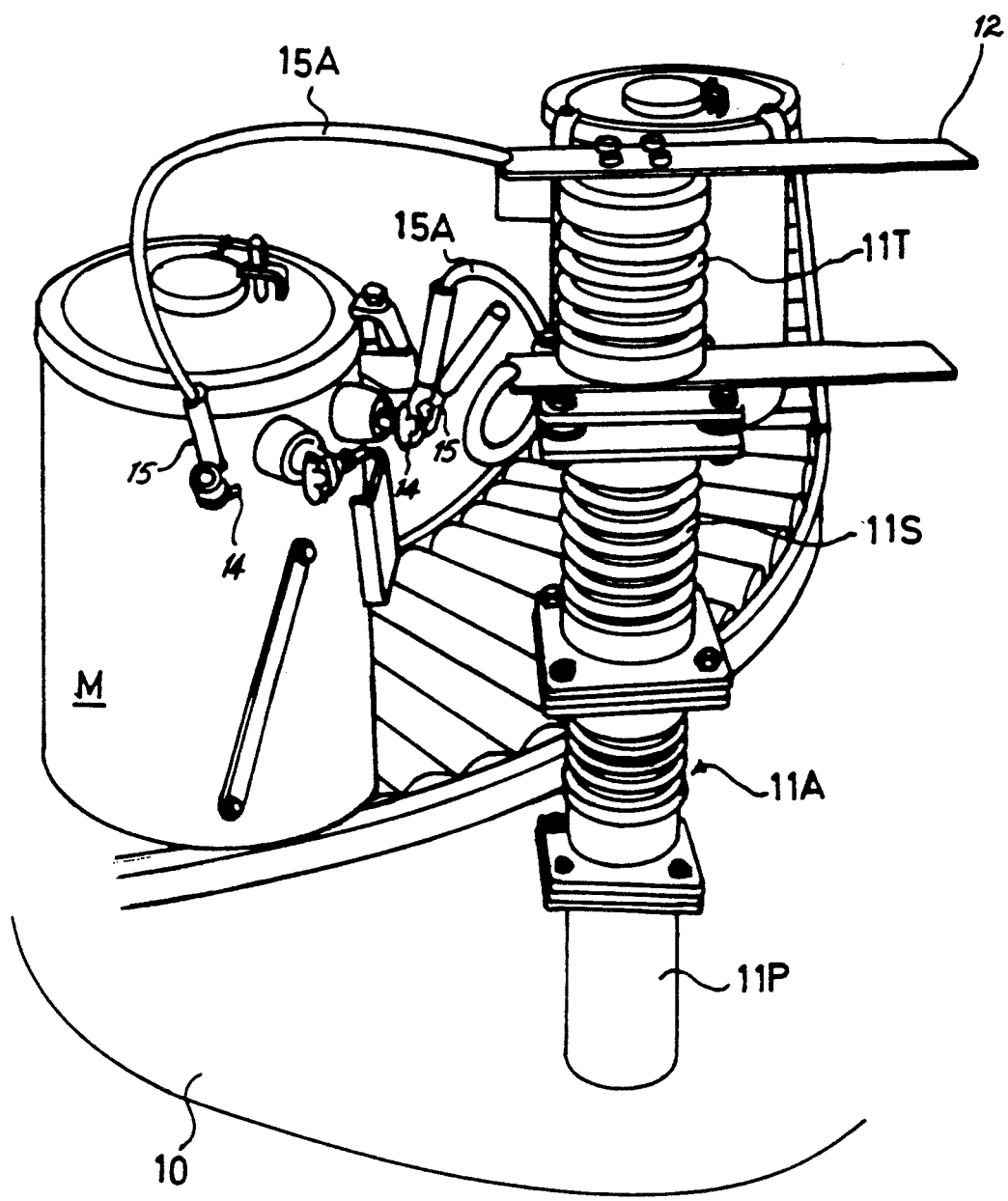
FIG. 4 is a schematic drawing showing the clamps of a connecting post of a transformer being clamped onto the test terminals of a transformer.
Figure 5:
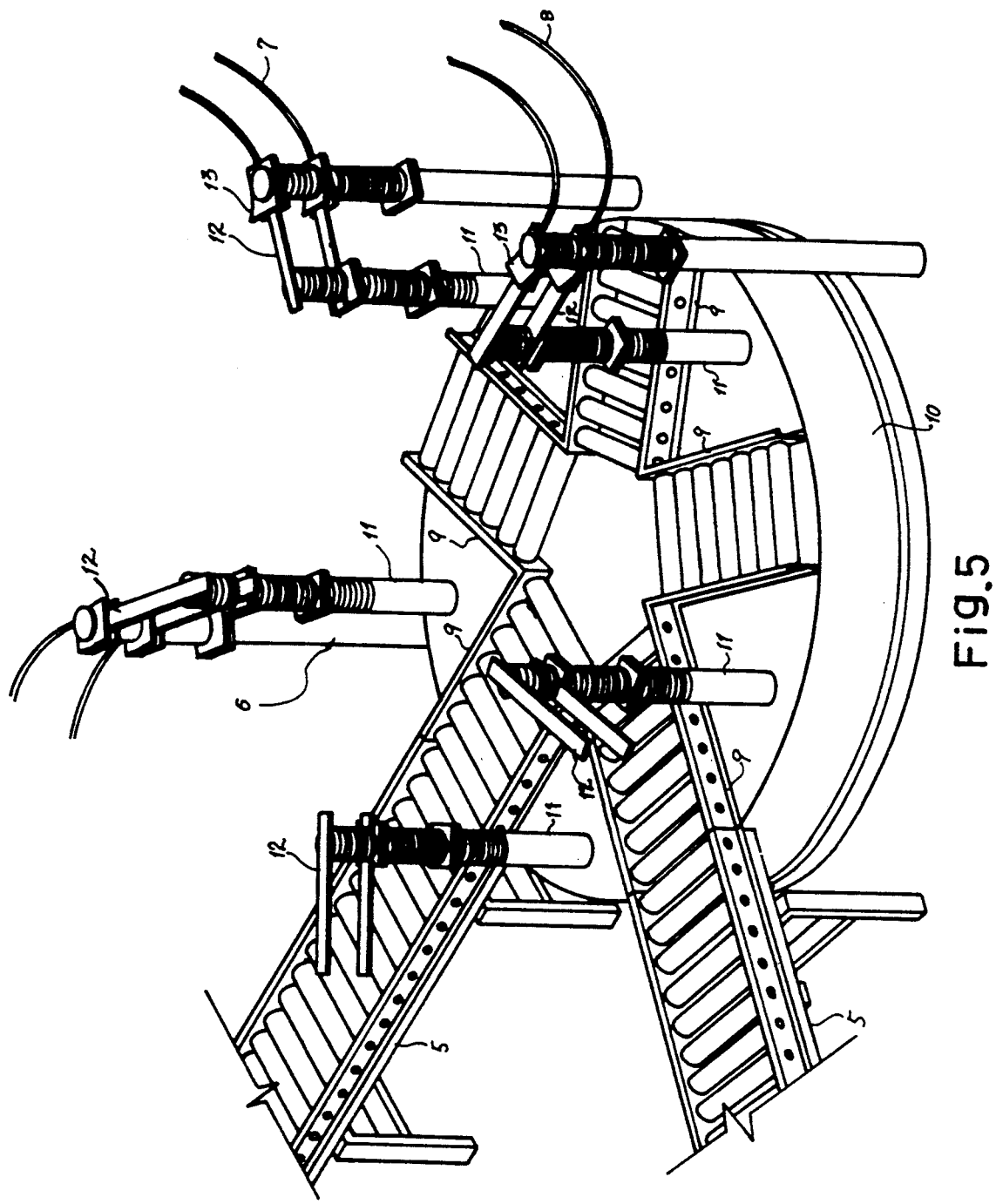
FIG. 5 is a perspective view showing the general arrangement of the apparatus of the present invention.

As shown in FIG. 4, first connecting post 11A has a column 11P fixedly mounted on rotatable circular platform 10, several insulators 11S connected in series at the upper part of column 11P, and a pair of connecting contact points 12A composed of a pair of conductive blades 12, 12 at the upper end the conductive blades 12, 12 being insulated from each other by an insulator 11T so as to withstand a high voltage. Each blade 12 has an outer end extending outwards with respect to rotatable circular platform 10, and an inner end to which a clamp 15 is connected by a cable 15A. Transformer M to be tested has a pair of test terminals 14 connected to a pair of conductive blades 12 by clamping test terminals 14 with clamps 15. Test terminals 14 may be stud and/or an appropriately projected part of the casing of the transformer, depending upon the construction of the transformer. Remaining connecting posts 11B-11E are identical with connecting post 11A.

Figure 6:
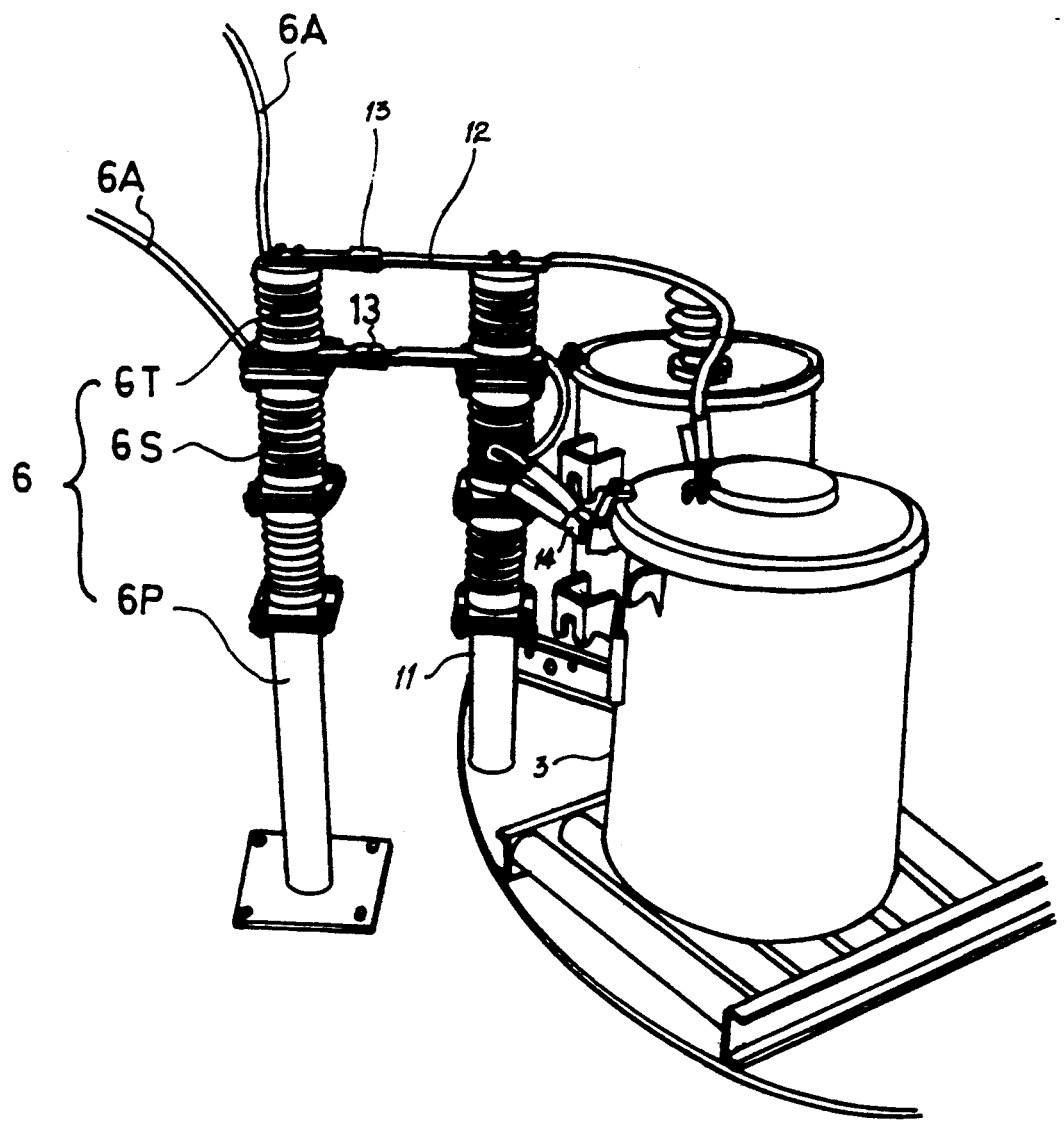
FIG. 6 is a perspective view showing the state when the connecting contact points of a connecting post are in contact with the stationary contact points of a stationary post, while the test terminals of a transformer are clamped onto the clamps of the connecting post.

As shown in FIG. 6, first stationary post 6 has a column 6P fixedly mounted on the floor, several insulators 6S connected in series at the upper part of column 6P, and a pair of stationary contact points 13 at the upper end. Stationary contact points 13 are made of conductive blades formed in the shape of a clip, and are insulated from each other by insulator 6T. Each one of the stationary contact points 13 has an appropriate gap to allow the outer end of one conductive blade 12 of a connecting post to slidably fit therein to constitute an electrical connection. First stationary connecting post 6 is so aligned that when the rotatable circular platform 10 rotates and one of connecting posts 11A-11E is moved to a position where the said connecting post corresponds with or is aligned with stationary connecting post 6, the outer ends of the pair of conductive blades 12 (connecting contact points) fit into the gaps of a pair of stationary contact points 13 of the first stationary post 6, and the rotatable circular platform 10 is caused to stop for a pre-determined period. Stationary contact points 13 are connected to a central test instrument 21 (FIG. 2) with cables 6A. Remaining stationary connecting posts 7 and 8 are identical with first stationary post 6 so their arrangement will not be described.

Referring to FIG. 2, the automatic transformer test apparatus of this application is further provided with a supply conveyor C1 for moving the transformers to be tested from a storage area to rotatable circular platform 10, and a transit conveyor C2 for moving the already tested transformers from rotatable circular platform 10 back to the storage area. The plurality of carrier tracks 9A-9E are so arranged that at each stop of rotatable circular platform 10, one of the carrier tracks is aligned with supply conveyor C1 to receive a transformer to be tested from supply conveyor C1 and another carrier track is aligned with transit conveyor C2 for unloading the already tested transformer to transit conveyor C2. Also at each stop of rotatable circular platform 10, connecting posts 11A-11E of carrier tracks 9A-9E other than those aligned with supply conveyor C1 and transit conveyor C2 are aligned with stationary connecting posts 6, 7 and 8 so that the transformers loaded onto the said carrier tracks can be simultaneously tested.

The operation of the automatic transformer test apparatus of this application can be described as follows:

At an initial stop, first carrier track 9A is aligned with supply conveyor C1 as shown in FIG. 2. First transformer M1 is moved from supply conveyor C1 to first carrier track 9A (a loading process). As first transformer M1 is appropriately loaded onto first carrier track 9A, the pair of test terminals 14 of first transformer M1 are connected to connecting contact points 12A of first connecting post 11A by clamping test terminals 14 with clamps 15 of connecting post 11A. During this process, connecting contact points 12A of connecting post 11 are disconnected from central test instrument 21 and, therefore, no electrical power is applied on to connecting post 11, and the clamps 15 can thus be manually put on test terminals 14 of first transformer M1 by the test operator without the operator being exposed to the risk of electric shock.

Figure 3:
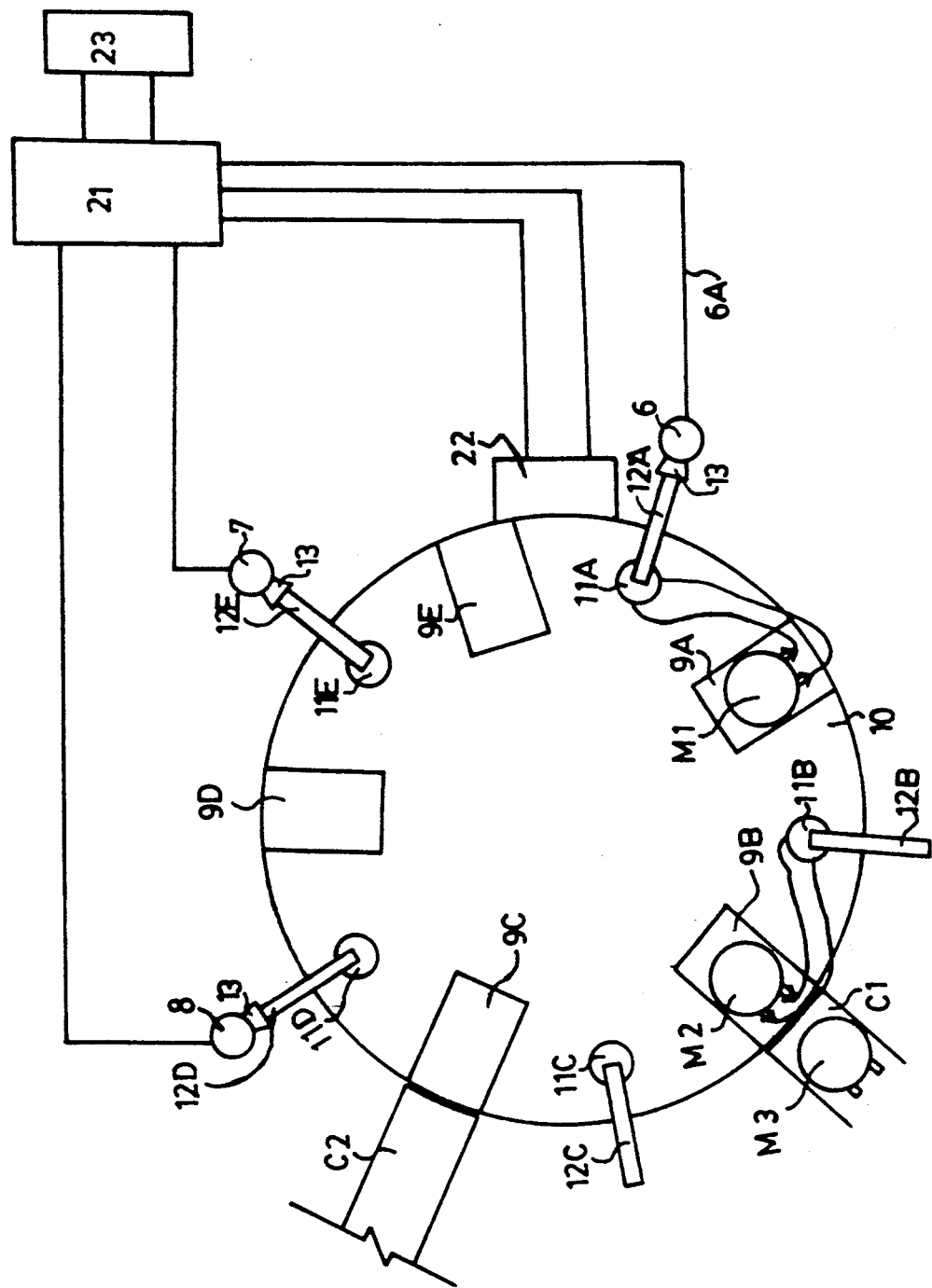
FIG. 3 is a schematic plan view similar to that of FIG. 2, showing the state when the first transformer has been moved to a first test position and a second transformer is being loaded onto the apparatus at a second loading position.

As soon as the above-described loading of first transformer M1 and the connection of first transformer M1 to first connecting post 11A is completed, rotatable circular platform 10 is caused to rotate at a pre-determined angular increment so as to move first transformer M1 to a first test position, where first connecting post 11A is aligned with first stationary connecting post 6 as shown in FIG. 3. At this position, connecting contact points 12A engage with stationary contact points 13 of first stationary connecting post 6 and rotatable circular platform 10 is caused to stop, and an appropriate voltage is applied from central test instrument 21 to first transformer M1 at the first test position through first stationary post 6 and first connecting post 11A to conduct the first test, which may be a NO-LOAD LOSS TEST. During this period, a second transformer M2 is moved from supply conveyor C1 and loaded onto second carrier track 9B which is at the loading position to align with supply conveyor C1, and the test operator can proceed to connect second transformer M2 with connecting contact points 12B of the second connecting post 11B by clamping test terminals 14 of second transformer M2 with clamps 15 of second connecting post 11B, as shown in FIG. 3.

As soon as the first test is completed, rotatable circular platform 10 is caused to rotate again for the same angular increment to move first transformer M1 from first test position to a second test position where first connecting post 11A is aligned with second stationary post 7, and at the same time, the second transformer M2 is moved from the loading position to the first test position. At this position, first transformer M1 undergoes a second test, and second transformer M2 undergoes the first test. During this period, a third transformer M3 is moved from supply conveyor C2 to third carrier track 9C, which is now at the loading position to receive third transformer M3.

The above-described test procedure is repeated to complete the three tests of first transformer M1, and the rotatable circular platform 10 finally is caused to rotate such that first transformer M1 is moved to an unloading position where first carrier track 9A is aligned with transit conveyor C2. At this position, first transformer M1 is moved from first carrier rack 9B to transit conveyor C2 to be forwarded to a finished product storage area; at the same time, transformers M2 and M3 are undergoing testing at their respective test positions.

The intermittent rotation of rotatable circular platform 10 can be pre-programmed and controlled by computer-controlled driving device 22 in association with central test instrument 21. The program or the sequence for operating the rotatable circular platform 10 may vary with the type of test to be conducted as well as the types of transformers to be tested. Moreover, the numbers of carrier tracks to be aligned on the upper side of the rotatable circular platform 10 can also vary to depend on the number of tests to be performed on the transformer; however, it should be noted that two extra carrier tracks are necessary with respect to the number of tests to be performed so as to enable the loading and unloading of transformers during testing of the other transformers, so as to avoid time loss during the loading and unloading process.

As a preferred embodiment of the Automatic Transformer Testing Apparatus of the invention is described as above with references to the drawings, it should be understood that modifications are possible; the conductive blades 12 employed as connecting points can be replaced with a curved leaf spring and stationary contact point 13 in the shape of a clip may also be replaced with another curved leaf spring to enable a friction engagement with the curved leaf spring which may replace conductive blades 12. Moreover, clamps 15 can also be replaced with a snapping type socket to fit on a projected part provided on the transformer to be tested. Therefore, the spirit and the scope of this invention are to be defined by the appended claims.

What is claimed:

1. An automatic power transformer testing apparatus comprising:
   a rotatable circular platform provided with a plurality of carrier tracks of which each one is adapted to carry one power transformer having a pair of test terminals;
   a plurality of connecting posts mounted on said rotatable circular platform to correspond with said plurality of carrier tracks, each one of said connecting posts having a pair of connecting contact points provided with clamping means for detachably connecting said test terminals of said power transformer to said connecting contact points;
   a plurality of stationary posts of which each one has a pair of stationary contact points electrically connected to a test instrument to test the performances of said power transformer, said stationary contact points being adapted to allow a sliding engagement with said connecting contact points of said connecting posts;
   a driving device for causing said rotatable circular platform to rotate an angular increment each time to stop at a position where said connecting contact points of said connecting posts engage with said stationary contact points, and to repeat the rotation as soon as said test instrument completes a performance test.

2. The automatic transformer testing apparatus as recited in claim 1, wherein said connecting contact point is a conductive blade and said stationary contact point is a conductive plate formed into a clip shape having a gap which allows said conductive blade to slidably fit in to said gap.

3. The automatic transformer testing apparatus as recited in claim 1, wherein the number of said plurality of carrier tracks is two more than the number of said plurality of stationary posts.

* * * * *